(12) United States Patent
Jeong et al.

(10) Patent No.: US 8,414,708 B2
(45) Date of Patent: Apr. 9, 2013

(54) METHOD AND APPARATUS FOR CLEANING PHOTOMASK

(75) Inventors: Yun-song Jeong, Hwaseong-si (KR);
Hyung-ho Ko, Hwaseong-si (KR);
Sung-jae Han, Seongnam-si (KR);
Kyung-noh Kim, Hwaseong-si (KR);
Chan-uk Jeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 277 days.

(21) Appl. No.: 12/846,181

(22) Filed: Jul. 29, 2010

(65) Prior Publication Data
US 2011/0023914 A1 Feb. 3, 2011

(30) Foreign Application Priority Data
Aug. 3, 2009 (KR) .................. 10-2009-0071303

(51) Int. Cl.
*B08B 3/04* (2006.01)

(52) U.S. Cl. ............ 134/30; 134/18; 134/21; 134/25.5; 134/26; 134/32; 134/33; 134/34; 134/36; 134/37; 134/42; 134/99.1; 134/102.2; 134/182; 134/198; 430/5; 216/57; 216/92; 510/175; 239/290

(58) Field of Classification Search ........ 430/5; 216/57, 216/92; 510/175; 134/18, 21, 25.5, 26, 30, 134/32, 33, 34, 36, 37, 42, 99.1, 102.2, 182, 134/198; 239/290
See application file for complete search history.

(56) References Cited

U.S. PATENT DOCUMENTS

| 5,474,616 | A | * | 12/1995 | Hayami et al. | ................. 134/32 |
| 6,260,562 | B1 | * | 7/2001 | Morinishi et al. | .......... 134/57 R |
| 6,458,216 | B1 | * | 10/2002 | Williams | ........................ 134/34 |
| 2005/0115671 | A1 | * | 6/2005 | Araki | ...................... 156/345.12 |
| 2008/0053487 | A1 | * | 3/2008 | Goto et al. | ....................... 134/32 |
| 2009/0255558 | A1 | * | 10/2009 | Inukai et al. | .................... 134/30 |
| 2010/0078039 | A1 | * | 4/2010 | Wu et al. | ........................... 134/1 |

FOREIGN PATENT DOCUMENTS

| JP | 2005-266534 A | 9/2005 |
| JP | 2006-139271 A | 6/2006 |

* cited by examiner

*Primary Examiner* — Bibi Carrillo
(74) *Attorney, Agent, or Firm* — Lee & Morse, P.C.

(57) ABSTRACT

Provided is a method and apparatus for cleaning a photomask. The photomask including a first region and a second region surrounding the first region, a pattern to be protected disposed on the first region, and a material to be removed exists on the second region. A cleaning liquid is sprayed from an inside region of the second region toward an outer region of the second region to remove the material, and a gas is blown from the first region toward the second region to protect the pattern.

14 Claims, 5 Drawing Sheets

METHOD AND APPARATUS FOR CLEANING PHOTOMASK

BACKGROUND

1. Field

The embodiments relate to a method of manufacturing a semiconductor device, and more particularly, to a method and apparatus for cleaning a photomask.

2. Description of the Related Art

A photolithography process may be used to form a predetermined pattern on a semiconductor substrate. In particular, a photoresist pattern may be formed by transcribing a pattern of a photomask onto a photoresist layer of a semiconductor substrate, and a predetermined pattern may be formed by etching a semiconductor substrate or a material layer formed thereon by using the photoresist pattern.

The photomask may be used to form the photoresist pattern on the semiconductor substrate. For example, the photomask may be formed by making a shielding pattern made of a material such as chromium (Cr) on a transparent substrate, e.g., quartz. Then, a shielding pattern image is transcribed onto the photoresist layer of the semiconductor substrate by exposing the photomask on which the shielding pattern is formed.

However, when foreign substances exist on the photomask, the shielding pattern image may not be effectively transcribed onto the photoresist layer. In addition, when the exposing of the photomask is continually performed, haze or a critical dimension skew may occur on the photomask. Thus, during a manufacturing process of a semiconductor device, the photomask has to be periodically cleaned. The cleaning operation of the photomask may include removing a photoresist, removing foreign substances/particles/contamination substances, removing remnant pellicle adhesives, and/or the like.

SUMMARY

Embodiments are therefore directed to a method and apparatus for cleaning a photomask, which substantially overcome one or more of the problems due to the limitations and disadvantages of the related art.

It is therefore a feature of an embodiment to provide a method for cleaning a photomask that includes protecting a pattern formed on a first region of a photomask when removing a material deposited on a second region of the photomask.

It is therefore another feature of an embodiment to provide an apparatus for cleaning a photomask that is capable of protecting a pattern formed on a first region of a photomask and removing a material deposited on a second region of the photomask.

At least one of the above and other features and advantages may be realized by providing a method of cleaning a photomask, the method may include providing the photomask having a first region and a second region surrounding the first region, a pattern to be protected being disposed on the first region, and a material to be removed existing on the second region. Spraying a cleaning liquid from an inner region of the second region toward an outer region of the second region to remove material from the second region, and blowing a gas from the first region toward the second region.

The method may further include spraying deionized water from the inner region of the second region toward the outer region of the second region to remove the cleaning liquid, and blowing the gas from the first region toward the second region. The material to be removed may be remnant adhesives, and the remnant adhesives may exist on the second region along a parameter of the first region.

The method may further include providing a cleaning apparatus that includes a guide nozzle having a cleaning liquid nozzle and a blowing nozzle disposed on a rear surface of the cleaning liquid nozzle. The spraying of the cleaning liquid may include spraying the cleaning liquid from an inside region on which the material exists towards an outer region through the cleaning liquid nozzle, and the blowing of the gas may include blowing the gas from the rear surface of the deionized water nozzle towards the second region through the blowing nozzle. The guide nozzle may be disposed on at least one inner surface of a frame of the cleaning apparatus, and an area of a bottom surface of the frame may be equal to an area of the first region, or may be greater than the area of the first region and smaller than an area surrounded by the material.

The method may further include providing a cleaning apparatus including a frame having a guide plate. The spraying of the cleaning liquid may include spraying the cleaning liquid to an upper surface of the guide plate, and the blowing of the gas may include blowing the gas from an inside region of the frame, the frame surrounding the inside region. The cleaning liquid may be uniformly sprayed toward the second region by a plurality of gullies on the guide plate. An area of a bottom surface of the guide plate may be equal to an area of the first region, or may be greater than the area of the first region and smaller than an area surrounded by the material, and the frame may have a quadrangular pyramid shape.

The method may further include providing a cleaning apparatus including a frame having a guide, the frame substantially overlapping the pattern. The spraying of the cleaning liquid may be in a direction toward the inner region through a first guide attached to a frame of the cleaning apparatus, and the blowing gas may be in a direction toward the first region through a second guide in an inside region of the frame of the cleaning apparatus. The inside region may be substantially enclosed by the frame. The gas may be blown simultaneously with the spraying of the cleaning liquid.

The method may further include providing a cleaning apparatus including a guide nozzle having a cleaning liquid nozzle, a deionized water nozzle disposed on a rear surface of the cleaning liquid nozzle, and a blowing nozzle disposed on a rear surface of the deionized water nozzle. The spraying of the cleaning liquid may include spraying the cleaning liquid from an inside region on which the material exists towards an outer region through the cleaning liquid nozzle, the spraying of the deionized water may include spraying the deionized water from the inside region of the second region towards the outer region of the second region through the deionized water nozzle, and the blowing of the gas may include blowing the gas from the rear surface of the deionized water nozzle towards the second region through the blowing nozzle. The guide nozzle may be disposed on at least one inner surface of a frame of the cleaning apparatus, and an area of a bottom surface of the frame may be equal to an area of the first region, or may be greater than the area of the first region and smaller than an area surrounded by the material.

The method may further include providing a cleaning apparatus including a frame having a guide plate. The spraying of the cleaning liquid may include spraying the cleaning liquid to an upper surface of the guide plate, the spraying of the deionized water may include spraying the deionized water to the upper surface of the guide plate, and the blowing of the gas may include blowing the gas from an inside region of the frame, the frame surrounding the inside region. The cleaning liquid may be uniformly sprayed toward the second region by a plurality of gullies on the guide plate. An area of a bottom surface of the guide plate may be equal to an area of the first region, or may be greater than the area of the first region and smaller than an area surrounded by the material, and the frame may have a quadrangular pyramid shape.

The method may further include providing a cleaning apparatus including a frame having a guide, the frame substantially overlapping the pattern. Spraying the cleaning liquid in a direction toward the inner region through a first guide attached to a frame of the cleaning apparatus, blowing the gas in a direction toward the first region through a second guide in an inside region of the frame of the cleaning apparatus, the inside region being enclosed by the frame, and spraying the deionized water in the direction toward the inner region through a third guide attached to a frame of the cleaning apparatus.

The method may further include arranging a source for blowing the gas between the pattern and a source for spraying the cleaning liquid. The blowing of the gas may occur before and during the spraying of the cleaning liquid. The blowing of the gas may occur during and after the spraying of the cleaning liquid. The cleaning liquid may include a sulfuric acid ($H_2SO_4$) solution, and the gas may include clean dry air (CDA) or nitrogen ($N_2$) gas.

At least one of the above and other features and advantages may be realized by providing an apparatus for cleaning a photomask, the photomask may include a first region and a second region disposed outside of the first region, wherein a pattern to be protected is disposed on the first region, and a material to be removed is disposed on the second region. The apparatus may include an injection unit, and a frame receiving a cleaning liquid, deionized water, and a gas from the injection unit, the frame being capable of spraying the cleaning liquid from an inner region of the second region toward an outer region of the second region, and the frame being capable of blowing the gas from the first region toward the second region

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
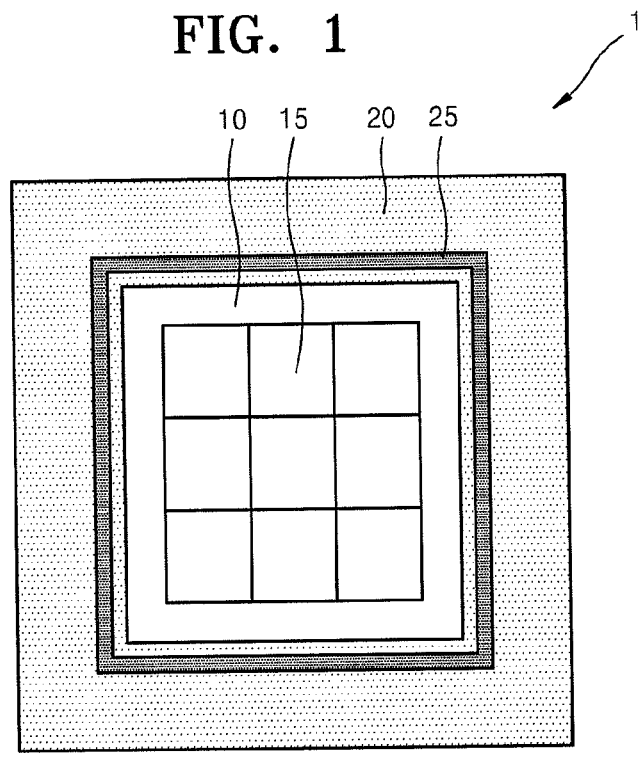
FIG. 1 illustrates a diagram of a photomask according to an exemplary embodiment.

Korean Patent Application No. 10-2009-0071303, filed on Aug. 3, 2009, in the Korean Intellectual Property Office, and entitled: "Method and Apparatus for Cleaning Photomask," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Moreover, in the drawings, the thicknesses of layers and regions may be exaggerated for clarity.

In the drawing figures, the dimensions of layers and regions may be exaggerated for clarity of illustration. It will also be understood that when an element is referred to as being "on" another element, it can be directly on the other element, or intervening elements may also be present. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

FIG. 1 illustrates a diagram of a photomask 1 according to an exemplary embodiment.

Referring to FIG. 1, a surface of the photomask 1 may be divided into a first region 10 and a second region 20. The first region 10 is an inner region of the surface of the photomask 1, on which a pattern 15 may be formed. The second region 20 is an outer region of the surface of the photomask 1, and may surround the first region 10. A pollutant material 25 may exist, e.g., may be generated during pattern formation and/or deposited, on the second region 20. In detail, in a cleaning process of the photomask 1, the first region 10 may be a protected region on which the pattern 15 to be protected from a cleaning liquid is formed. The second region 20 may be a cleaning region on which the pollutant material 25, e.g., remnant adhesives, to be removed by the cleaning liquid exists.

Hereinafter, the "pollutant material 25" and "remnant adhesives 25" will be used interchangeably and to exemplify description of a method of cleaning the photomask 1. However, embodiments are not limited to this case, and the method according to the embodiments may also be used to remove other materials existing on the photomask 1. In addition, although in FIG. 1 the remnant adhesives 25 are shown as forming a profile having a tetragonal shape, the embodiments are not limited to removing material existing on the photomask 1 in a tetragonal shape surrounding the first region and may include removal of materials that form various profiles on the photomask 1, e.g., circular shapes, etc.

For example, the pollutant material 25 may be remnant pellicle adhesives. Pellicle is a protective layer that may be attached to a surface of the pattern 15 of the photomask 1 in order to prevent the contamination of the pattern 15. That is, the pellicle may prevent foreign substances from becoming attached to the photomask 1, prior to using the photomask 1 in a photolithography process. The pellicle may be attached to the surface of the pattern 15 of the photomask 1 by using predetermined adhesives, and then the remnant pellicle adhesives may be removed. For example, according to an exemplary embodiment, the remnant pellicle adhesives may be removed with a cleaning liquid, e.g., a liquid including sulfuric acid ($H_2SO_4$).

Figure 2:
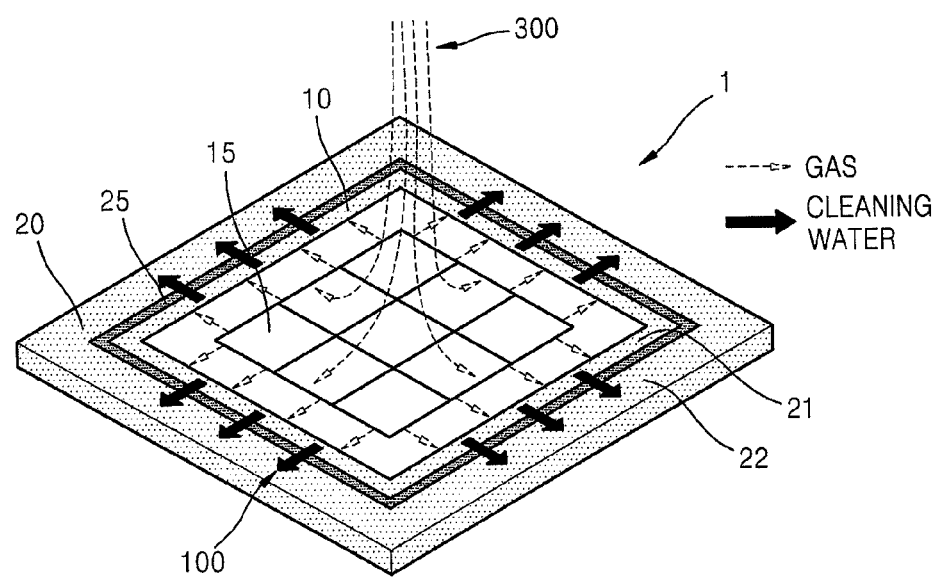
FIG. 2 illustrates a schematic diagram for explaining a method of cleaning a photomask according to an exemplary embodiment.

FIG. 2 illustrates a schematic diagram for explaining an exemplary method of cleaning a photomask according to an exemplary embodiment.

Referring to FIG. 2, a cleaning liquid 100 may be sprayed from a position above the photomask 1. As illustrated in FIG. 2, the cleaning liquid 100 may be sprayed, e.g., flow along a direction, from an inner region 21 of the second region 20 toward an outer region 22 of the second region 20 in order to remove pollutant material 25, e.g., the remnant pellicle adhesives, from the second region 20 of the photomask 1. In particular, the cleaning liquid 100 may be sprayed from an inside of a profile, e.g., a line, formed by the remnant adhesives 25 on the second region 20 toward an outside of the profile. Thus, the cleaning liquid may flow from the inner region 21, i.e., a region adjacent to the first region 10, toward the outer region 22, i.e., a region along an outermost edge of the photomask 1. The cleaning liquid 100 may be sequentially sprayed along various directions toward the remnant adhesives 25. Alternatively, a time taken to perform a cleaning operation may be reduced by spraying the cleaning liquid 100 simultaneously in all directions, as illustrated in FIG. 2.

In an exemplary embodiment, the cleaning liquid 100 may be a sulfuric acid ($H_2SO_4$) solution. However, the cleaning liquid 100 is not limited to a sulfuric acid ($H_2SO_4$) solution, and may be variously changed, e.g., may be cleaning water, according to the material, e.g., substances/particles/contamination substances, and/or the like, on the photomask 1 to be removed.

In order to protect the pattern 15 from the cleaning liquid 100, a gas 300 may be blown toward the photomask 1. In an exemplary embodiment, a gas source may be positioned above the first region 10 of the photomask 1, and the gas 300 may be blown from a region above the first region 10 in a direction oriented from the first region 10 toward the second region 20. By blowing the gas 300 in the direction from the first region 10 toward the second region 20, the cleaning liquid 100 may flow from the inner region 21 of the second region 20 toward the outer region 22 along the photomask 1, without flowing into the pattern 15 of the first region 10. As such, although the photomask 1 is cleaned, the pattern 15 of the photomask 1 may not be directly exposed to the cleaning liquid 100. For example, the gas 300 may be blown simultaneously and radially to flow across an entire perimeter of the photomask 1.

The gas 300 may be, e.g., clean dry air (CDA) or nitrogen ($N_2$) gas. However, the gas 300 is not limited thereto, and may vary, e.g., according to the cleaning liquid 100 being used to clean the photomask 1.

By flowing the gas 300 in a direction oriented away from the region 10, the cleaning liquid 100 sprayed toward the photomask 1 may be directed away from the region 10 and the pattern 15. By protecting the cleaning liquid 100 from directly flowing into the pattern 15 during the cleaning operation of the photomask 1, a change in critical dimension or optical density, or inverse contamination may be prevented or substantially minimized on the photomask 1. Moreover, a reduction in the lifetime of the photomask 1 may be minimized. In contrast, conventional cleaning methods, e.g., immersing a photomask with pellicle adhesives in a sulfuric acid ($H_2SO_4$) bath, or rotating the photomask while the sulfuric acid ($H_2SO_4$) is applied to the pellicle adhesive may directly expose a pattern on a photomask to the sulfuric acid ($H_2SO_4$) solution, thereby causing, e.g., a critical dimension to be changed due to loss in chromium (Cr) in a case of a binary mask, or the optical density of a blind region to be changed in a case of a phase shift mask (PSM). Additionally, the lifetime of a photomask may be reduced, e.g., by the changes in the critical dimension and/or optical density of the photomask. Further, inverse contamination may occur when a surface of a pattern formed on a photomask is directly exposed to a $H_2SO_4$ solution during conventional cleaning for removing pellicle adhesives, e.g., byproducts may be generated on the photomask following the removal processes causing inverse contamination, and thus defects may be formed on the photomask.

The exemplary embodiment where the gas 300 is blown after the cleaning liquid 100 is sprayed has been described. According to this embodiment, it may be advantageous to blow the gas 300 as quickly as possible after the cleaning liquid 100 is sprayed, so that the cleaning liquid 100 does not flow into the first region 10 before the gas 300 is blown.

Embodiments are not limited to the circumstance of the gas 300 being blown after the cleaning liquid 100 is sprayed. For example, the gas 300 may be blown before the cleaning liquid 100 is sprayed. In another example, the cleaning liquid 100 may be sprayed at the same time as the gas 300 is blown. Various combination of the gas 300 being blown and the cleaning liquid 100 being sprayed may be used, e.g., the gas 300 may be blown simultaneously with the cleaning liquid 100 being sprayed and after the cleaning liquid 100 is sprayed, or the gas 300 may be blown before and during spraying of the cleaning liquid 100.

Figure 3:
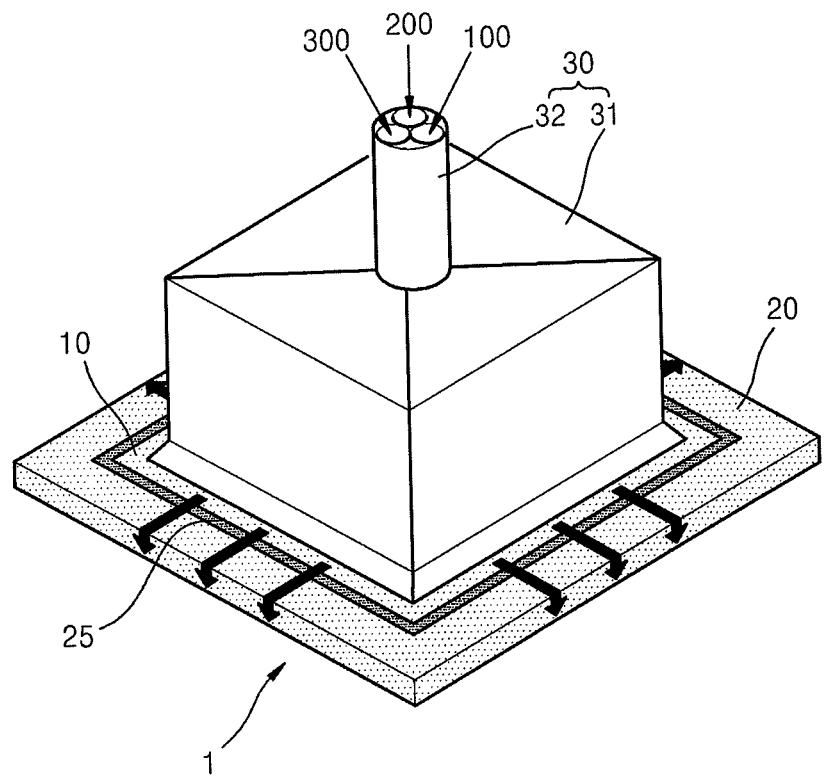
FIG. 3 illustrates a perspective view of an apparatus for cleaning a photomask according to an exemplary embodiment.

FIG. 3 illustrates a perspective view of an apparatus 30 for cleaning a photomask according to an exemplary embodiment.

Figure 4:
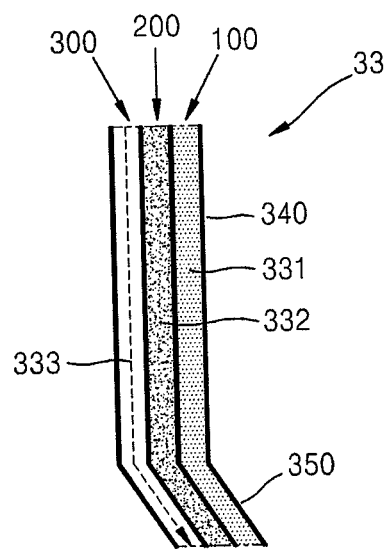
FIG. 4 illustrates a schematic cross-sectional view of an exemplary guide nozzle of the apparatus illustrated in FIG. 3.

Referring to FIG. 3, the apparatus 30 may include a pillar frame 31 and an injection unit 32. The apparatus 30 may also include a plurality of guide nozzles 33 (FIG. 4). As illustrated in FIG. 3, the pillar frame 31 may have a square or rectangular shaped frame. However, in other embodiments the pillar frame 31 may have various shapes such as, e.g., a pyramidal shape, a quadrangular pyramidal shape, a polygonal frame shape, a spherical shape, or a like shape.

The injection unit 32, as shown in FIG. 3, may have a circular cylindrical shape, and may include three, e.g., separated, cylinders for respectively injecting the cleaning liquid 100, deionized water 200, and the gas 300 into the pillar frame 31. However, in other embodiments, the injection unit 32 may include multiple, e.g., circular, cylinders according to the number of materials to be injected therethrough. The injection unit 32 may have various shapes, e.g., a square tube shape, a rectangular tube shape, a triangular tube shape, a polygonal tube shape, or a like shape. The cylinders may have any suitable shape, e.g., may be appropriately shaped according to the shape of the injection unit 32.

Referring to FIG. 3, an area of a bottom surface, i.e., a surface facing the photomask 1, of the pillar frame 31 may be substantially the same as the area of the first region 10, or may be greater than the area of the first region 10 and smaller than the area surrounded by the profile, e.g., lines, formed by the remnant adhesives 25. For example, pillar frame 31 may be positioned to, e.g., completely, overlap the first region 10. According to an exemplary embodiment, the remnant adhesives 25 may be formed in lines constituting a square, and thus the apparatus 30 may include the pillar frame 31 shaped as a square frame. However, the apparatus 30 may include a frame having another shape substantially corresponding to a shape formed by the remnant adhesives 25 on the second region 20 of the photomask 1 or a shape of the first region 10.

The plurality of guide nozzles may be disposed on inner surfaces of the pillar frame 31, e.g., inside the pillar frame 31. For example, guide nozzles for blowing gas may also be dispersed throughout the pillar frame. An interval between the guide nozzles may be changed, and the arrangements of the guide nozzles may be changed. For example, the guide nozzles may be disposed only on one surface of the multiple surfaces of the pillar frame 31, so the remnant adhesives 25 surrounding all the multiple surfaces of the pillar frame 31 may be previously or separately removed, e.g., sequentially. Alternatively, the guide nozzles may be disposed on all of the multiple surfaces, e.g., the four surfaces, of the pillar frame 31, and the remnant adhesives 25 surrounding all the surfaces of pillar frame 31 may be simultaneously removed.

FIG. 4 illustrates a cross-sectional view of an exemplary guide nozzle 33 in the apparatus 30 shown in FIG. 3.

Referring to FIG. 4, the guide nozzle 33 may include first, second, and third nozzles 331, 332, and 333, respectively. The guide nozzle 33 may include the first nozzle 331 for spraying the cleaning liquid 100, the second nozzle 332 for spraying the deionized water 200, and the third nozzle 333 for blowing the gas 300. However, in other embodiments, the guide nozzle 33 may include two nozzles, or alternatively may include four or more nozzles. For example, the number of nozzles in the guide nozzle 33 may be dependent on the number of solutions and gases to be supplied to the photomask 1. For example, the guide nozzle 33 may include multiple nozzles that supply a same solution or gas to the photomask 1, e.g., the guide nozzle 33 may include two or more nozzles for blowing the gas 300.

According to an exemplary embodiment, the first, second, and third nozzles 331, 332, and 333 may be arranged in a row. For example, the first nozzle 331 may be disposed at the rightmost portion, e.g., directly on an inner surface of the pillar frame 31, of the guide nozzle 33, the second nozzle 332 may be disposed next to, e.g., on a rear surface of, the first nozzle 331, and the third nozzle 333 may be disposed next to, e.g., on a rear surface of, the second nozzle 332. However, in other embodiments, the arrangement order of the first nozzle 331 and the second nozzle 332 may be reversed. Alternatively, the first nozzle 331 and the second nozzle 332 may both be disposed, e.g., adjacent a side surface of the injection unit 32 or directly on the inner surface of the pillar frame 31, and the third nozzle 333 may be disposed behind, e.g., between a center of the pillar frame 31 and first nozzle 331, the first nozzle 331 and the second nozzle 332.

As shown in FIG. 4, an upper portion 340 of the guide nozzle 33 may have a substantially linear shape, and a lower portion 350 of the guide nozzle 33 may be bent relative to the upper portion 340 in a direction toward the second region 20 of the photomask 1. For example, upper portion 340 and lower portion 350 may correspond, e.g., may be conformed to, the sidewalls of the pillar frame 31. A bending degree $\theta$ of the guide nozzle 33, i.e., an angle formed between the upper portion 340 and the lower portion 350 of the guide nozzle 33, may be determined according to the position of the material or remnant adhesives 25 that are to be removed from the photomask 1. For example, the bending degree $\theta$ may be less than 180° degrees and more than 90° degrees. As such, a spraying direction of the cleaning liquid 100 and the deionized water 200 and a blowing direction of the gas 300 through the guide nozzle 33 may be angled toward the outer region 22 of the surface of the photomask 1. As such, the pattern 15 formed on the first region 10 may be protected from the cleaning liquid 100 and the deionized water 200.

A shape of the guide nozzle 33 is not limited to the shape shown in FIG. 4. For example, the guide nozzle 33 may have various shapes such as a straight shape, a 'V' shape, a 'U' shape, a triangular shape, a square shape, a polygonal shape, or a circular shape.

Figure 5A:
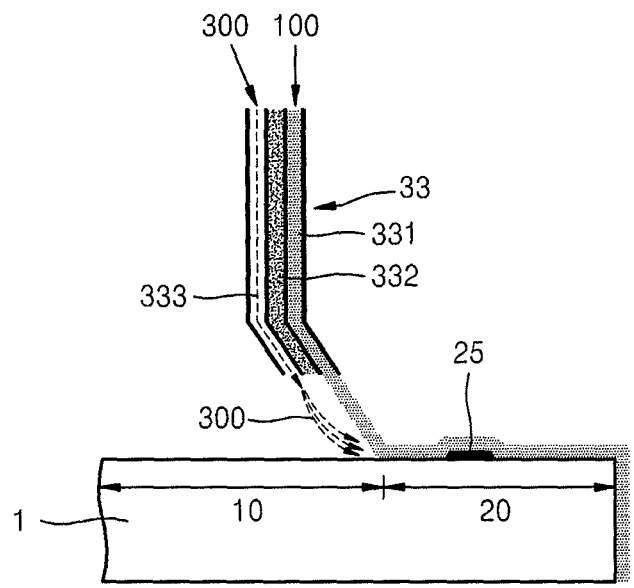
FIGS. 5A and 5B illustrate cross-sectional views for explaining an exemplary method of cleaning a photomask by using the apparatus illustrated in FIG. 3.
Figure 5B:
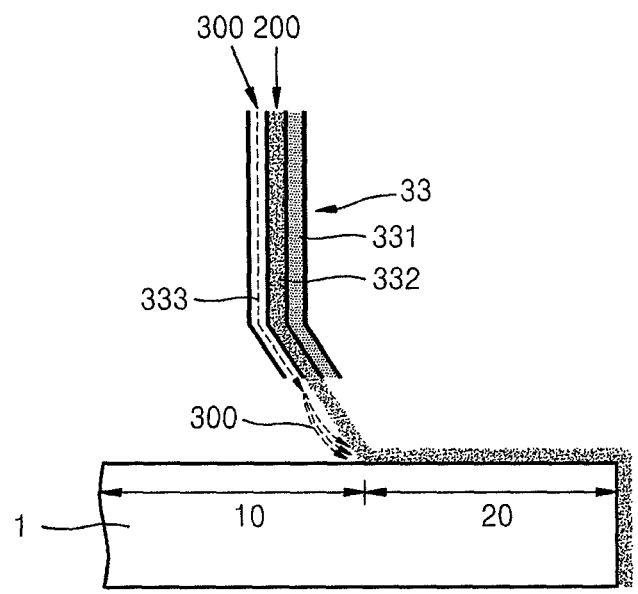

FIGS. 5A and 5B illustrate cross-sectional views for explaining an exemplary method of cleaning a photomask by using the apparatus 30 of FIG. 3. For convenience of description, in FIGS. 5A and 5B, only the photomask 1 and a single guide nozzle 33 are illustrated. However, there may be other guide nozzles 33 positioned throughout the pillar frame 31.

FIG. 5A illustrates a cross-sectional view of an exemplary operation of removing the remnant adhesives 25 of the photomask 1 by using the apparatus 30 of FIG. 3.

Referring to FIG. 5A, the cleaning liquid 100 may be sprayed in a direction from the inner region 21 of the second region 20 of the photomask 1 to the outer region 22 of the second region 20 through the first nozzle 331. The gas 300 may be blown in the direction from the first region 10 of the photomask 1 toward the second region 20 through the third nozzle 333. Thus, according to an exemplary embodiment, since the gas 300 is blown in this direction, the cleaning liquid 100 may not flow into the first region 10 and only flow toward the second region 20. Thus, the remnant adhesives 25 left on the second region 20 may be removed by the cleaning liquid 100, and the pattern 15 formed on the first region 10 may not be directly exposed to the cleaning liquid 100 so as to be protected from the cleaning liquid 100. In other words, the guide nozzle 33 may be configured so the cleaning liquid 100 may flow through the first nozzle 331 to contact, e.g., only the second region 20, as illustrated in FIG. 5A. As further illustrated in FIG. 5A, the third nozzle 333 may be arranged between the first nozzle 331 and a center of the apparatus 30, so the gas 300 may be blown from the first region 10 toward the second region 20.

FIG. 5B illustrates a cross-sectional view of an exemplary operation of rinsing the cleaning liquid 100 on the second region 20 of the photomask 1 by using the apparatus 30 of FIG. 3.

Referring to FIG. 5B, the deionized water 200 may be sprayed in a direction from the inner region 21 of the second region 20 of the photomask 1 toward the outer region 22 of the second region 20 through the second nozzle 332. In addition, the gas 300 may be blown in a direction from the first region 10 of the photomask 1 toward the second region 20 through the third nozzle 333. Thus, according to an exemplary embodiment, since the gas 300 is blown in this direction, the deionized water 200 may not flow into the first region 10 and only flow toward the second region 20. Thus, the cleaning liquid 100 left on the second region 20 may be removed by the deionized water 200, and the pattern 15 formed on the first region 10 may not be directly exposed to the deionized water 200 so as to be protected from the deionized water 200.

Figure 6:
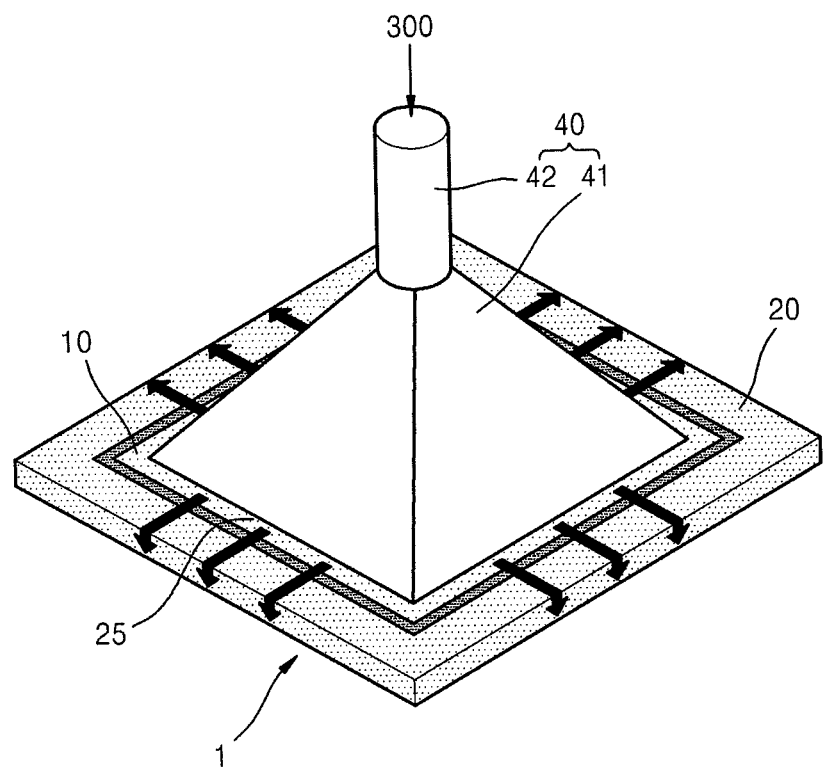
FIG. 6 illustrates a perspective view of an apparatus for cleaning a photomask according to another exemplary embodiment.

FIG. 6 illustrates a perspective view of an exemplary apparatus 40 for cleaning the photomask 1.

Referring to FIG. 6, the apparatus 40 may include a pyramid frame 41 and an injection unit 42. For example, as illustrated in FIG. 6, the pyramid frame 41 may have a quadrangular pyramid shape, and a surface of the pyramid frame 41 may function as guide plates. Hereinafter, the surfaces constituting the pyramid frame 41 and guide plates will be used interchangeably.

The injection unit 42 may have, e.g., a circular cylindrical shape, and may include three, e.g., separated, cylinders, e.g., concentric cylinders, for respectively injecting the cleaning liquid 100, deionized water 200, and the gas 300 toward the pyramid frame 41. However, in other embodiments, the injection unit 42 may include multiple cylinders according to the number of materials to be injected therethrough. The injection unit 42 may have various shapes, e.g., a square tube shape, a rectangular tube shape, a triangular tube shape, a polygonal tube shape, or a like shape. The cylinders may have any suitable shape, e.g., may be appropriately shaped according to the shape of the injection unit 42.

As illustrated in FIG. 6, the area of a bottom surface of the pyramid frame 41, i.e., a surface facing the photomask 1, may be substantially equal to an area of the first region 10, or may be greater than the area of the first region 10 and smaller than an area surrounded by a profile, e.g., lines, formed by the material or remnant adhesives 25. According to an exemplary embodiment, the remnant adhesives 25 may be formed in lines constituting a square, and thus the apparatus 40 may include the pyramid frame 41 shaped as a quadrangular pyramid. However, according to other embodiments, the apparatus 40 may include a frame having another shape substantially corresponding to a profile, e.g., a shape, formed by the remnant adhesives 25 on the second region 20 of the photomask 1.

The guide plates forming the surfaces of the pyramid frame 41 in apparatus 40 may include a plurality of gullies, which may be formed like the ribs of a fan, formed thereon. Thus, when the cleaning liquid 100 or the deionized water 200 is provided onto upper surfaces of the pyramid frame 41, the cleaning liquid 100 or the deionized water 200 may be uniformly sprayed onto the photomask 1 along the gullies of the guide plates.

The pyramid frame 41 may have a multi-layered structure including at least two layers. In this case, the cleaning liquid 100 may be provided to an upper layer, and the deionized water 200 may be provided to a lower layer. In other words, the upper layer may be arranged so an initial contact point of the cleaning liquid 100 on the photomask 1 may be closer to the second region 20 than the initial contact point of the deionized water 200 on the photomask 1. However, according to other embodiments, the pyramid frame 41 may include more than three layers according to the number of solutions required for a cleaning process, e.g., the arrangement of the upper layer, the lower layer, and the cylinders in the apparatus 40 may correspond to each other.

Figure 7A:
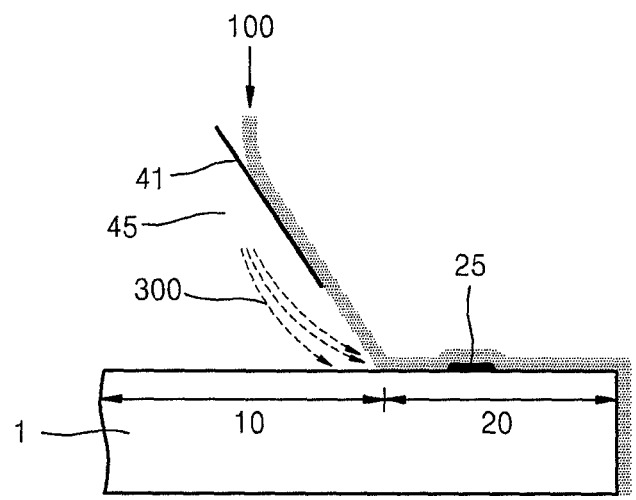
FIGS. 7A and 7B illustrate cross-sectional views for explaining an exemplary method of cleaning a photomask by using the apparatus illustrated in FIG. 6.
Figure 7B:
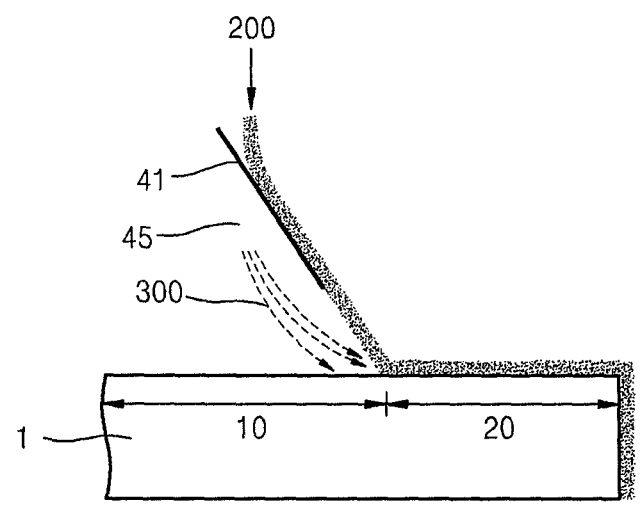

FIGS. 7A and 7B illustrate cross-sectional views for explaining an exemplary method of cleaning a photomask by using the apparatus 40 of FIG. 6. For convenience of description, FIGS. 7A and 7B illustrate the photomask 1 and one layer of a guide plate forming a surface of the pyramid frame 41.

FIG. 7A illustrates a cross-sectional view of an exemplary operation of removing the remnant adhesives 25 of the photomask 1 by using the apparatus 40 of FIG. 6.

Referring to FIG. 7A, the cleaning liquid 100 may be sprayed to flow from the inner region of the second region 20 of the photomask 1 toward the outer region of the second region 20 by providing the cleaning liquid 100 along an inclined upper surface of the pyramid frame 41, e.g., on at least one guide plate of the upper layer. The gas 300 may be blown in a direction from the first region 10 of the photomask 1 toward the second region 20, e.g., simultaneously with the spraying of the cleaning liquid 100. The gas 300 may be provided from an inside region 45 of the pyramid frame 41. The inside region 45 may be surrounded, e.g., completely surrounded, by the pyramid frame 41. The inside region 45 may also include a plurality of nozzles and/or tubes for blowing the gas 300 from the first region 10 toward the second region 20.

Thus, according to an exemplary embodiment, since the gas 300 is blown in the direction from the first region 10 toward the second region 20, e.g., continuously during spraying of the cleaning liquid 100, the cleaning liquid 100 may not flow into the first region 10 and may only flow toward the second region 20. Thus, the remnant adhesives 25 left on the second region 20 may be removed by the cleaning liquid 100, and the pattern 15 formed on the first region 10 may not be not directly exposed to the cleaning liquid 100 so as to be protected from the cleaning liquid 100.

FIG. 7B illustrates a cross-sectional view of an exemplary operation of rinsing the cleaning liquid 100 on the second region 20 of the photomask 1 by using the apparatus 40 of FIG. 6.

Referring to FIG. 7B, the deionized water 200 may be sprayed from the inner region of the second region 20 of the photomask 1 toward the outer region of the second region 20 by providing the deionized water 200 to an inclined upper surface of the pyramid frame 41, e.g., on at least on guide plate of the lower layer. In addition, the gas 300 may be blown from the first region 10 of the photomask 1 toward the second region 20 by providing the gas 300 from the inside region 45 of the pyramid frame 41. Thus, according to an exemplary embodiment, since the gas 300 is provided between the pattern 15 on the photomask 1 and deionized water 200, the gas 300 may blow away from the pattern 15, and the deionized water 200 may not flow into the first region 10 and may flow only toward the second region 20. Thus, the cleaning liquid 100 left on the second region 20 may be removed by the deionized water 200, and the pattern 15 formed on the first region 10 may not be directly exposed to the deionized water 200 so as to be protected from the deionized water 200.

Although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Further, spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. The terms "comprises" and/or "comprising" when used in this specification, specify the presence of stated features, steps, operations, elements, and/or components, but do not preclude the presence or addition of one or more other features, steps, operations, elements, components, and/or groups thereof.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of cleaning a photomask, the method comprising:
   providing the photomask including a first region and a second region surrounding the first region, a pattern to be protected being disposed on the first region, and a material to be removed existing on the second region;

providing a cleaning apparatus including a guide nozzle having a cleaning liquid nozzle and a blowing nozzle disposed on a rear surface of the cleaning liquid nozzle, the guide nozzle being arranged on at least one inner surface of a frame of the cleaning apparatus;

spraying a cleaning liquid from an inner region of the second region toward an outer region of the second region to remove the material from the second region, the cleaning liquid being sprayed from the inner region on which the material exists towards the outer region through the cleaning liquid nozzle; and blowing a gas from the first region toward the second region, the gas being blown from the rear surface of the cleaning liquid nozzle towards the second region through the blowing nozzle, and an area of a bottom surface of the frame of the cleaning apparatus being equal to an area of the first region, or is greater than the area of the first region and smaller than an area surrounded by the material.

2. A method of cleaning a photomask, the method comprising:

providing the photomask including a first region and a second region surrounding the first region, a pattern to be protected being disposed on the first region, and a material to be removed existing on the second region;

spraying a cleaning liquid from an inner region of the second region toward an outer region of the second region to remove the material from the second region;

blowing a gas from the first region toward the second region; and providing a cleaning apparatus including a frame having a guide plate such that an area of a bottom surface of the frame is equal to an area of the first region, or is greater than the area of the first region and smaller than an area surrounded by the material, wherein:

the spraying of the cleaning liquid includes providing the cleaning liquid to an upper portion of the guide plate, and the blowing of the gas includes blowing the gas from an inside region of the frame, the frame surrounding the inside region.

3. The method as claimed in claim 2, wherein the frame has a quadrangular pyramid shape.

4. The method as claimed in claim 2, wherein:
the frame substantially overlaps the pattern;
the cleaning liquid is sprayed toward the inner region through a first guide attached to the frame; and
the gas is blown toward the first region through a second guide in the inside region of the frame of the cleaning apparatus, the inside region being substantially enclosed by the frame.

5. A method of cleaning a photomask, the method comprising:

providing the photomask including a first region and a second region surrounding the first region, a pattern to be protected being disposed on the first region, and a material to be removed existing on the second region;

providing a guide nozzle on at least one inner surface of a frame of a cleaning apparatus such that an area of a bottom surface of the frame is equal to an area of the first region, or is greater than the area of the first region and smaller than an area surrounded by the material;

spraying a cleaning liquid from an inner region of the second region toward an outer region of the second region to remove the material from the second region, a source for spraying the cleaning liquid being the guide nozzle; and blowing a gas from the first region toward the second region, a source for blowing the gas being arranged between the pattern and the source for spraying the cleaning liquid.

6. The method as claimed in claim 5, wherein the gas is blown simultaneously with the spraying of the cleaning liquid.

7. The method as claimed in claim 5, further comprising spraying deionized water from the inner region of the second region toward the outer region of the second region to remove the cleaning liquid, a source for spraying the deionized water being the guide nozzle, wherein the source for blowing the gas is the guide nozzle.

8. The method as claimed in claim 5, wherein the frame has a quadrangular pyramid shape.

9. The method as claimed in claim 5, wherein
the frame substantially overlaps the pattern.

10. The method as claimed in claim 5, wherein the blowing of the gas occurs before and during the spraying of the cleaning liquid.

11. The method as claimed in claim 5, wherein the blowing of the gas occurs during and after the spraying of the cleaning liquid.

12. The method as claimed in claim 5, wherein the material to be removed is remnant adhesives, and the remnant adhesives are disposed on the second region along a parameter of the first region.

13. The method as claimed in claim 5, wherein the cleaning liquid is a sulphuric acid ($H_2SO_4$) solution, and the gas is clean dry air (CDA) or nitrogen ($N_2$) gas.

14. The method as claimed in claim 7, further comprising:
the guide nozzle includes a cleaning liquid nozzle as the source for spraying the cleaning liquid, a deionized water nozzle disposed on a rear surface of the cleaning liquid nozzle as the source for spraying the deionized water, and a blowing nozzle disposed on a rear surface of the deionized water nozzle as the source for blowing the gas, wherein:

the spraying of the cleaning liquid includes spraying the cleaning liquid from the inner region on which the material exists towards the outer region through the cleaning liquid nozzle, the spraying of the deionized water includes spraying the deionized water from the inner region of the second region towards the outer region of the second region through the deionized water nozzle, and the blowing of the gas includes blowing the gas from the rear surface of the deionized water nozzle towards the second region through the blowing nozzle.

* * * * *